United States Patent [19]

Littmann et al.

[11] Patent Number: 5,055,377

[45] Date of Patent: Oct. 8, 1991

[54] LIGHT-SENSITIVE RECORDING ELEMENT AND PROCESS OF FORMING A RELIEF IMAGE WHEREIN THE RECORDING ELEMENT CONTAINS LECITHIN AS AN ADDITIVE

[75] Inventors: Dieter Littmann, Mannheim; Horst Koch, Gruenstadt, both of Fed. Rep. of Germany

[73] Assignee: BASF Aktiengesellschaft, Ludwigshafen, Fed. Rep. of Germany

[21] Appl. No.: 404,280

[22] Filed: Sep. 7, 1989

[30] Foreign Application Priority Data

Sep. 17, 1988 [DE] Fed. Rep. of Germany ....... 3831680

[51] Int. Cl.$^5$ .......................... G03C 1/77; G03F 7/032; G03F 7/028
[52] U.S. Cl. ...................................... 430/271; 430/273; 430/277; 430/278; 430/281; 430/283; 430/285; 430/286; 430/288; 430/306; 430/307; 430/325
[58] Field of Search ............... 430/285, 288, 281, 286, 430/306, 325, 283, 307, 273, 277, 278

[56] References Cited

U.S. PATENT DOCUMENTS

| | | | |
|---|---|---|---|
| 3,453,311 | 7/1969 | Miller | 260/453 |
| 3,585,031 | 6/1971 | Hayes | 96/33 |
| 3,677,756 | 7/1972 | Protzman | 96/36 |
| 4,162,919 | 7/1979 | Richter et al. | 96/87 R |
| 4,239,850 | 12/1980 | Kita et al. | 430/285 |
| 4,327,170 | 4/1982 | Sander et al. | 430/285 |
| 4,451,553 | 5/1984 | Fickes et al. | 430/306 |
| 4,576,898 | 3/1986 | Hoffmann et al. | 430/306 |
| 4,935,333 | 6/1990 | Kimoto et al. | 430/306 |
| 4,940,649 | 7/1990 | Aldag et al. | 430/281 |
| 4,959,285 | 9/1990 | Hoffmann | 430/281 |

FOREIGN PATENT DOCUMENTS

| | | |
|---|---|---|
| 614181 | 2/1961 | Canada . |
| 945800 | 4/1974 | Canada . |
| 70/0384 | 3/1973 | South Africa . |

Primary Examiner—Charles L. Bowers, Jr.
Assistant Examiner—John S. Y. Chu
Attorney, Agent, or Firm—Keil & Weinkauf

[57] ABSTRACT

A novel light-sensitive recording element for preparing relief plates or relief printing plates comprises a dimensionally stable base and at least one photopolymerizable recording layer (A) consisting essentially of at least one polymer as binder, at least one photopolymerization initiator, at least one photopolymerizable olefinically unsaturated compound (monomer) which is compatible with the polymeric binder, and/or photopolymerizable olefinically unsaturated radicals which are linked internally and/or terminally to the polymeric binder, and at least one additive, the said additive or at least one of the said additives being selected from the group consisting of the lecithins of the general formulae I and II

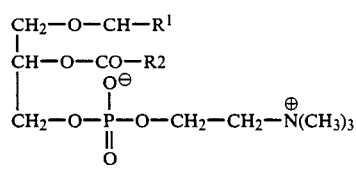

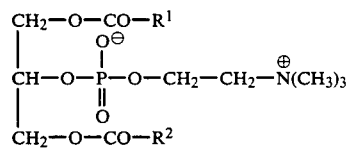

where $R^1$ and $R^2$, which may be identical to or different from each other, are each $C_{11}$–$C_{18}$-alkyl or $C_{11}$–$C_{18}$-alkenyl, with the proviso that at least one of $R_1$ and $R_2$ is $C_{11}$–$C_{18}$alkenyl, the photopolymerizable recording layer (A) preferably containing from 0.1 to 10% by weight, based on the recording layer (A), of the lecithins of the general structures I and II.

4 Claims, No Drawings

LIGHT-SENSITIVE RECORDING ELEMENT AND PROCESS OF FORMING A RELIEF IMAGE WHEREIN THE RECORDING ELEMENT CONTAINS LECITHIN AS AN ADDITIVE

The present invention relates to a light-sensitive recording element for preparing relief plates and relief printing plates, comprising at least one photopolymerizable recording layer (A) composed of at least one binder, at least one photopolymerization initiator, at least one photopolymerizable olefinically unsaturated compound (monomer) which is compatible with the binder and/or photopolymerizable olefinically unsaturated radicals linked internally and/or terminally to the polymeric binders, and at least one additive.

Light-sensitive recording elements of the type mentioned at the beginning have been known for a long time. To prepare relief plates and relief printing plates, their photopolymerizable recording layer (A) is subjected to imagewise exposure under actinic light, which photopolymerizes the irradiated areas, thereby crosslinking them and rendering them insoluble in the developer. Thereafter the remaining areas of the imagewise exposed recording layer (A) are washed out by means of a suitable developer to leave a photopolymerized relief layer (A').

However, a relief layer (A') prepared from a prior art light-sensitive recording element and having the relief printing height of about 300 $\mu$m to 1 cm usually used in the printing industry will usually not have the desired crisp and fine structure and will frequently have insufficiently large relief flank angles, which can be ascribed to a comparatively high degree of scattering of the actinic light in the photopolymerizable recording layer (A) during imagewise exposure.

There have already been attempts to eliminate, or at least reduce, these disadvantages by adding certain additives which improve the relief structure, namely sensitometric regulators, to the photopolymerizable recording layer (A) of prior art light-sensitive recording elements.

For instance, DE-A-2,722,421 reveals a light-sensitive recording element whose photopolymerizable recording layer (A) contains from 0.001 to 0.1% by weight of an alkylthioanthraquinone having from 1 to 12 carbon atoms in the alkyl radical in homogeneous dispersion to improve the relief structure. It is true that these compounds do indeed bring about a certain improvement in the relief structure, but they fall short of meeting all the practical requirements. They not only require careful handling, but, on account of their self-color, they also interfere with the visual assessment of the imagewise exposed recording layer (A) before and after development. Similar remarks apply to the 10,10'-bisanthrones and 9-nitroanthracene which are recommended in DE-A-2,720,599 for improving the relief structure of light-sensitive recording elements of the type in question, and also to 9,9'-dianthronyl, which is proposed for this purpose in DE-A-2,720,560. Although even comparatively small amounts of this compound bring about a certain improvement in the relief structure, this does not compensate for the other disadvantages of these compounds. Moreover, the relief structure improvement is not further enhanceable by using larger amounts of these compounds; on the contrary, this makes the other disadvantages of these compounds still more manifest.

A distinct advance in the art is the recommendation of DE-A-3,248,247 of a combination of from 0.0001 to 1% by weight of a phenoxazinium, phenazinium, acridinium or phenothiazinium dye and from 0.005 to 5% by weight of a mild reducing agent which is only capable of reducing the dye in question in the excited state. However, if light-sensitive recording elements which contain this dye/reducing agent system are not properly handled it is possible for undesirable photoinitiated reactions to occur in the photopolymerizable recording layer (A), which impair the application profile of the recording elements.

All prior art methods of relief structure improvement have the use of highly colored compounds in common. These highly colored compounds are washed out as well in the course of the development of imagewise exposed photopolymerizable recording layers (A) of the light-sensitive recording elements, and discolor the spent developer, which makes reuse and/or environmentally safe disposal even more difficult. In addition, the standard of quality expected of relief plates and relief printing plates prepared by means of photopolymerizable recording layers (A) has steadily risen in recent years in the printing and electronics industries, which necessitates continuous development of the methods of relief structure improvement.

It is also already known to use lecithins in the context of image production by means of light-sensitive recording elements.

For instance, U.S. Pat. No. 3,585,031 and CA-A-945,800 disclose numerous imaging processes which are carried out by means of layers of lecithins, or actinic radiation sensitive phosphatide compounds. These imaging processes utilize the propensity of lecithin layers of providing latent images on imagewise exposure to actinic light (UV light, $\beta$-rays, X-rays). These latent images can then be developed in a wide variety of ways either to produce durable individual copies or be suitable for producing multiple copies.

For instance, the latent image generated in a lecithin layer by imagewise exposure to actinic light can be made visible for example by heating, by storing in the dark for 1–7 days or by dipping into an aqueous copper-/ammonium chloride solution. Furthermore, a visible image can be obtained by dipping the latent image into an aqueous potassium iodide solution. In this technique, the peroxides present in the imagewise exposed areas of the lecithin layers liberate iodine from the potassium iodide solution, forming a clearly visible image.

It is also already known to utilize the peroxides in the imagewise irradiated areas of lecithin layers to initiate the imagewise polymerization in free-radical photopolymerizable recording layers. To this end, an imagewise exposed lecithin layer is placed directly on top of a free-radical photopolymerizable recording layer, composed for example of diethylene glycol dimethacrylate and cellulose acetate succinate or polyesters of polyols and $\alpha,\beta$-olefinically unsaturated dicarboxylic acids, and the peroxides in the lecithin layer then initiate a free-radical polymerization in the free-radical polymerizable recording layer underneath. This polymerization can be speeded up by heating. The polymerization in question here is thus a purely thermally initiated free-radical polymerization which must be strictly avoided in photopolymerizable recording layer (A) since otherwise their reproductive quality is dramatically impaired to the point of complete inutility.

Furthermore, the latent image in a lecithin layer can also be made visible by first coating the imagewise exposed lecithin layer with an apolar high-melting wax and then heating the layer to above the melting point of the wax. On heating, the imagewise exposed areas of the latent image become hydrophilic, while the nonexposed areas become hydrophobic or oleophilic.

The molten wax flows away from the hydrophilic areas and collects in the hydrophobic oleophilic areas. On cooling, the result is thus a wax relief on the surface of the lecithin layer. This imagewise differentiation within the lecithin surface can also be utilized in the opposite sense by using instead of the hydrophobic wax a high-melting water-soluble substance which will collect in the hydrophilic areas. Suitable for this purpose are for example sorbitol, dextrose, polyvinyl acetate and polyvinyl alcohol. The use and the mechanism of action of lecithins in photopolymerizable recording layer (A) is not mentioned anywhere in either U.S. Pat. No. 3,585,031 or CA-A-945,800.

A further imaging process involving the use of lecithin is known from DE-A-2,146,779. In this imaging process, use is made of a light-sensitive layer which on imagewise exposure to actinic light and depending on its material composition either becomes tacky in its exposed areas, so that etching powders adhere thereto (negative-acting layer), or become hard in its exposed areas, so that etching powders do not adhere thereto, while the unexposed areas remain tacky (positive-acting layer).

DE-A-2,146,779 recommends that positive-acting layers be formed on the basis of soylecithin, partially hydrogenated lecithin or dilinolenyl-$\alpha$-lecithin (as film former) in conjunction with from 0.001 to 2 times, in particular from 0.001 to 0.8 times, the weight of the film former of photoinitiators, such as acyloins or vicinal diketones. In addition, dyes can be used as coinitiators and customary and known plasticizers can be used to improve the film-forming properties. By raising the photoinitiator content to at least the weight of the film former the positive-acting layers are converted to negative-acting ones. Following imagewise exposure of these highly sensitive layers under actinic light, etching powders are applied on top and adhere either to the exposed or to the unexposed areas of the layers. Thereafter the nonadherent portions of etching powder are removed, leaving a pattern of etching powder corresponding to the original image. The etching powder, or the etching substance present therein, is then brought into contact in various ways with the etchable layerlike materials underneath the light-sensitive layers, the final result being an etched pattern in the layerlike materials.

A version of this process whereby iron(III) chloride is used as a particularly preferred photoactivator for lecithins is revealed in ZA-A-70/0384.

Neither DE-A-2,146,779 nor ZA-A-70/0384 reveal anything which might suggest that lecithins be used in photopolymerizable recording layers (A) for the purpose of relief structure improvement. On the contrary, the numerous different reaction mechanisms of lecithins, especially their tendency to form peroxides and their subsequent transformation following imagewise exposure to actinic light, might lead the skilled worker to expect that their use in photopolymerizable recording layers (A), far from producing any beneficial technical effect, would on the contrary entail serious disadvantages.

It is an object of the present invention to devise a new light-sensitive recording element comprising at least one photopolymerizable recording layer (A) composed of at least one polymeric binder, at least one photopolymerization initiator, at least one photopolymerizable olefinically unsaturated compound (monomer) which is compatible with the binder, and/or photopolymerizable olefinically unsaturated radicals linked internally and/or terminally to the polymeric binders, and at least one additive, which permits the faithful production of relief plates and relief printing plates showing well-formed relief structures even in the case of very fine image details.

The new light-sensitive recording element should also be free of the prior art disadvantages. More particularly, on imagewise exposure to actinic light and development it should lead to relief plates and relief printing plates having an improved relief structure.

We have found in particular that this object is achieved by a light-sensitive recording element which contains at least one photopolymerizable recording layer (A) of the type in question which in turn contains one or more lecithins of the type described hereinafter in more detail as additives.

The present invention accordingly provides a novel light-sensitive recording element for preparing relief plates and relief printing plates, comprising at least one photopolymerizable recording layer (A) composed of (a$_1$) at least one polymer as binder, (a$_2$) at least one photopolymerization initiator, (a$_3$) at least one photopolymerizable olefinically unsaturated compound (monomer) which is compatible with polymeric binder (a$_1$) and/or photopolymerizable olefinically unsaturated radicals linked internally and/or terminally to polymeric binder (a$_1$), and (a$_4$) at least one additive, wherein the photopolymerizable recording layer (A) contains as additives (a$_4$) from 0.1 to 10% by weight, based on the photopolymerizable recording layer (A), of (a$_{41}$) one or more lecithins of the general formulae I and/or II

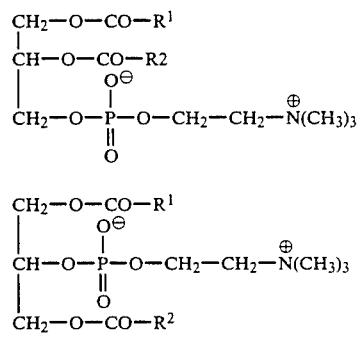

where $R^1$ and $R^2$ are identical or different and each is $C_{11}$-$C_{18}$-alkyl or $C_{11}$-$C_{18}$-alkenyl, with the proviso that at least one of $R_1$ and $R_2$ is $C_{11}$-$C_{18}$-alkenyl.

In the context of the present invention, the term "compatible" indicates in general that the constituent in question can be molecularly dispersed in the photopolymerizable recording layer (A) without causing cloudiness or schlieren and does not separate out with time.

"Additives" here are compounds with which it is possible in general to obtain controlled variation, usually an improvement, in the application properties of light-sensitive recording layers, in particular photopolymerizable recording layers (A). These improvements become evident in particular in relief plates, letter press, flexographic and intaglio printing plates and photoresist elements fabricated from the light-sensitive recording layers which contain these additives.

Relief plates are for example imagewise structured photoresist layers and decorative reliefs.

Relief printing plates are for example letter press, flexographic and intaglio printing plates produced from the unphotopolymerized precursor plate elements.

The novel light-sensitive recording element for preparing relief plates and relief printing plates, which has at least one photopolymerizable recording layer (A), will hereinafter be referred to as the "recording element according to the invention" for short.

The essential constituent of the recording element according to the invention is its novel photopolymerizable recording layer (A).

The essential constituents of the novel photopolymerizable recording layer (A) are the additives ($a_{41}$), ie. the lecithins I and/or II. Lecithins are a specific group of phospholipids, namely phosphatidylcholines, where phosphoric acid is esterified on the one hand with choline and on the other with glycerol and the free hydroxyl groups of the glycerol are esterified with long-chain fatty acids. Lecithins occur in nature almost exclusively as lecithins I, which are also referred to as α-lecithins. By comparison, lecithins II, also called β-lecithins, are rare in nature.

According to the invention, the novel photopolymerizable recording layer (A) of the recording element according to the invention contains at least one lecithin I or II. Or, however, the novel photopolymerizable recording layer (A) contains at least one lecithin I and at least one lecithin II. Either of these lecithins I and/or II are the sole additives ($a_{41}$), or other additives ($a_4$) are present, as well as the obligatory lecithins I and/or II (additives $a_{41}$).

Irrespectively of whether the lecithins I and/or II are used alone or together with other additives ($a_4$), they are present in the novel photopolymerizable recording layer (A) in an amount of from 0.1 to 10% by weight. It is in general not advisable here to increase the level of lecithins I and/or II in the novel photopolymerizable recording layer (A) to beyond 10% by weight, since this may lead in certain circumstances to undesirable side reactions in the novel photopolymerizable recording layer (A) in the course of its storage and/or during or after its imagewise exposure. On the other hand, the proportions of lecithins I and/or II in the novel photopolymerizable recording layer (A) should in general not be less than 0.1% by weight, since otherwise the technical effects due to the lecithins I and/or II will not always fully meet the practical requirements. Accordingly, the range from 0.1 to 10% by weight is an optimum range within which the proportion of lecithins I and/or II in the novel photopolymerizable recording layer (A) can be varied and adapted to the particular photopolymerizable recording layer (A) used. Within this optimum range preference is given to the range from 0.5 to 5% by weight, since novel photopolymerizable recording layers (A) containing such an amount of lecithins I and/or II are particularly advantageous and give relief layers (A') having an excellent relief structure. Within this particularly preferred range according to the invention, preference is in turn given to the range from 0.8 to 4% by weight, since such an amount of lecithins I and/or II results in a particularly advantageous application profile of the novel photopolymerizable recording layer (A) in question. This means that this level of lecithins I and/or II represents the absolute optimum compromise between the requirement to use as little material on the one hand and the requirement of a maximum technical effect on the other and therefore is very particularly preferred according to the invention.

The lecithins I and/or II to be used according to the invention contain the radicals $R^1$ and $R^2$. These radicals $R^1$ and $R^2$ are each $C_{11}$–$C_{18}$-alkyl such as undecan-1-yl, dodecan-1-yl, tridecan-1-yl, tetradecan-1-yl, pentadecan-1-yl, hexadecan-1-yl, heptadecan-1-yl or octadecan-1-yl.

Or the radicals $R^1$ and $R^2$ are each $C_{11}$–$C_{18}$-alkenyl such as undec-2-, -3-, -4-, -5-, -6-, -7-, -8-, -9- or -10-en-1-yl; undec-3,6-, -4,7- or -7,10-dien-1-yl; dodec-2-, -3-, -4-, -5-, -6-, -7-, -8-, -9-, -10- or -11-en-1-yl; dodec-3,6- or -6,11-dien-1-yl; tridec-2-, -3-, -4-, -5-, -6-, -7-, -8-, -9-, -10-, -11- or -12-en-1-yl; tride-4,7,10-trien-1-yl; tetradec-2-, -3-, -4-, -5-, -6-, -7-, -8-, -9-, -10-, -11-, -12- or -13-en-1-yl; tetradec-4,10- or -5,8-dien-1-yl; pentadec-2-, -3-, -4-, -5-, -6-, -7-, -8-, -9-, -10-, -11-, -12-, -13- or -14-en-1-yl; hexadec-2-, -3-, -4-, -5-, -6-, -7-, -8-, -9-, -10-, -11-, -12-, -13-, -14- or -15-en-1-yl; heptadec-2-, -3-, -4-, -5-, -6-, -7-, -8-, -9-, -10-, -11-, -12-, -13-, -14-, -15- or -16-en-1-yl; heptadec-8,11-dien-1-yl; heptadec-8,10,12- or -8,11,14-trien-1-yl; octadec-2-, -3-, -4-, -5-, -6-, -7-, -8-, -9-, -10-, -11-, -12-, -13-, -14-, -15-, -16- or -17-en-1-yl; or octadec-6,15-, -7,10- or -9,11-dien-1-yl. These radicals $R^1$ and $R^2$ may be identical to or different from each other. If they are different from each other, at least one of $R^1$ and $R^2$ is $C_{11}$–$C_{18}$-alkenyl. If $R^1$ and $R^2$ are identical, then $R^1$ and $R^2$ are each identical alkenyls from the group of the $C_{11}$–$C_{18}$-alkenyls. Accordingly, the lecithins I and/or II to be used according to the invention always contain one olefinically unsaturated radical $R^1$ or $R^2$ or two olefinically unsaturated radicals $R^1$ and $R^2$.

Of the aforementioned radicals $R^1$ and $R^2$, undecan-1-yl, tridecan-1-yl, pentadecan-1-yl, heptadecan-1-yl, cis-heptadec-8-en-1-yl, heptadec-8,11-dien-1-yl and heptadec-8,11,14-trien-1-yl, which are derived from lauric acid, myristic acid, palmitic acid, stearic acid, oleic acid, linoleic acid, linolenic acid, are particularly advantageous. Those lecithins I and/or II which contain these radicals are therefore particularly preferred according to the invention. Very particular preference is given to the relevant naturally occurring lecithins I, since they contain the radicals $R^1$ and/or $R^2$ in very particularly advantageous combinations. Of these natural lecithins I, soybean lecithin has to be singled out, since it brings about a very particularly advantageous technical effect in the novel photopolymerizable recording layers (A) of the recording element according to the invention.

The novel photopolymerizable recording layer (A) contains, based on its total amount, from 10 to 99, preferably from 25 to 95, in particular from 30 to 90, % by weight of one or more polymers as binders ($a_1$), suitable polymers for this purpose being all those polymers which are soluble or swellable in developers, which are miscible with the other constituents of the novel photopolymerizable recording layer (A) and which are compatible with these constituents. Examples of suitable polymers/binders ($a_1$) are polyamides, copolyamides, polyesters, polyurethanes, polyvinyl alcohols, polyalkadienes, aromatic vinyl/alkadiene block and non-block copolymers, alkadiene/acrylonitrile copolymers, butyl rubbers, acrylate rubbers, polychloroprenes, fluororubbers, polysulfide rubbers, silicone rubbers, ethylene-/propylene and ethylene/propylene/alkadiene rubbers, chlorosulfonated polyethylenes, ethylene/(meth)-acrylate, ethylene/vinyl acetate and ethylene/(meth)-acrylic acid copolymers and (meth)acrylic acid/(meth)-acrylate copolymers.

These suitable polymer binders ($a_1$) are known compounds and are prepared by customary and known methods of polymer chemistry.

Particularly advantageous binders ($a_1$) come from the classes of the polyamides, copolyamides, polyvinyl alcohols, polyalkadienes, aromatic vinyl/alkadiene block and non-block copolymers, alkadiene/acrylonitrile copolymers, ethylene/propylene/alkadiene rubbers and ethylene/-(meth)acrylic acid copolymers, or are selected therefrom for use.

Examples of particularly advantageous binders ($a_1$) from the class of the polyamides and copolyamides are linear homopolyamides and copolyamides prepared in a conventional manner from bifunctional carboxylic acids and diamines or from Ω-amino acids, lactams or suitable derivatives thereof, such as nylon 3, 4, 5, 6, 8, 11, 12, 13, 6.6, 6.10 or 6.13; or a polyamide formed from metaxylylenediamine and adipic acid or from trimethylhexamethylenediamine or isophoronediamine and adipic acid; or nylon 6/6.6, 6/6.6/6.10 or 6/6.6/6.10/6.12; or a polyamide formed from ε-caprolactam/adipic acid/-hexamethylenediamine/4,4-diaminodicyclohexylmethane or from ε-caprolactam/adipic acid/hexamethylenediamine/polyethylene glycol diamine; or the N-methylol or N-alkoxymethyl derivatives of all these homopolyamides and copolyamides; or homopolyamides and copolyamides of the type mentioned which contain photopolymerizable olefinically unsaturated radicals ($a_3$).

Examples of particularly advantageous binders ($a_1$) from the class of the polyvinyl alcohols are the water-soluble or -dispersible polyvinyl alcohols which contain 1-hydroxy-1,2-ethylidene repeat units

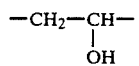

in the polymer chain and have number average molecular weights $\overline{M}_n$ of from $10^4$ to $10^5$, in particularly from $1.5 \times 10^4$ to $5 \times 10^4$, for example partially or virtually completely hydrolyzed polyvinyl acetate or propionate, the degree of hydrolysis being from 60 to 100% preferably from 70 to 99%, in particular from 75 to 95%. Of particular advantage are also the partially or virtually completely hydrolyzed vinyl alkanecarboxylate/alkylene oxide graft copolymers ($a_1$), in particular those obtained by grafting vinyl acetate or propionate onto polyethylene oxide and subsequent hydrolysis and are composed of, each percentage being based on the graft copolymer ($a_1$), from 10 to 30% by weight of 1-oxa-1,3-propylidene

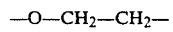

from 0 to 30% by weight of 1-acetyl-1,2-ethylidene

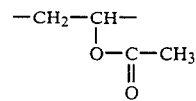

and from 90% to 40% by weight of 1-hydroxy-1,2-ethylidene units.

These polyvinyl alcohols ($a_1$) may contain, based on the original hydroxyl groups within the present polyvinyl alcohols, from 0.1 to 10, preferably from 0.5 to 8, in particular from 1 to 6, mol % of internal alkenecarboxylic ester radicals such as acrylic, methacrylic or maleic ester radicals introduced by conventional polymeranalogous reactions, or of alkenecarbonylamino-N-methylene ether radicals such as acrylamido- or methacrylamido-N-methylene ether radicals (=photopolymerizable olefinically unsaturated radicals ($a_3$)). These photopolymerizable olefinically unsaturated radicals ($a_3$) may also be present in the other binders ($a_1$).

Examples of particularly advantageous binders ($a_1$) from the class of the alkadiene polymers are natural rubbers, the homopolymers of butadiene or isoprene, butadiene/isoprene copolymers and the corresponding polymers which contain photopolymerizable olefinically unsaturated radicals ($a_3$).

Examples of particularly advantageous binders ($a_1$) from the class of the aromatic vinyl/alkadiene copolymers are copolymers of styrene and butadiene and/or isoprene where the monomers present as copolymerized units are in a random arrangement and where the amount of styrene present as copolymerized units is preferably from 10 to 50% by weight, or the corresponding copolymers which contain photopolymerizable olefinically unsaturated radicals ($a_3$).

Examples of particularly advantageous binders ($a_1$) from the class of the aromatic vinyl/alkadiene block copolymers are those which contain at least one elastomeric diene polymer block X and at least one thermoplastic aromatic vinyl polymer block Y and these blocks X and Y are in general chemically linked together via carbon—carbon bonds. In a given block copolymer, the link from one block X to a block Y can also be via a random or alternating copolymer which contains conjugated dienes and aromatic vinyls as copolymerized units, or via a copolymer of conjugated dienes and aromatic vinyls where the concentration of copolymerized conjugated dienes decreases from block X to block Y and the concentration of copolymerized aromatic vinyl increases from block X to block Y.

In addition, the block copolymers may be linked together via suitable polyvalent atoms or ions or via inorganic, organic or organometallic radicals to form still larger block copolymer assemblies, "linked together" having to be understood as meaning bonded together by the formation of covalent or ionic bonds between two radicals.

Moreover, the olefinic and aromatic bonds, or alternatively the olefinic bonds only, in the diene polymer block X may be present in a partially or completely hydrogenated form. Furthermore, the blocks X and Y may contain further monomers in copolymerized form which need not necessarily be conjugated dienes and aromatic vinyls, such as acrylonitrile, acrylic acid, maleic anhydride, (meth)acrylamides or (meth)acrylic esters, although the proportion thereof in the block copolymer should in general not exceed 10% by weight. These blocks X ray also contain aromatic vinyl in copolymerized form, in which case the amount of aromatic vinyl chosen is such that the elastomeric properties of the blocks X are not impaired. Similarly, the blocks Y may contain conjugated dienes in copolymerized form as long as their thermoplastic processibility is not lost. Furthermore, the block copolymers may contain photopolymerizable radicals ($a_3$).

If such a block copolymer contains a plurality of elastomeric blocks X and/or a plurality of thermoplastic blocks Y, then the blocks X and Y need not all be chemically identical, or substantially identical, but may each be quite distinct from the others, as long as they always have the required elastomeric or thermoplastic olefinically unsaturated properties.

In general, blocks X have a glass transition temperature Tg of below 20° C., preferably below 0° C., in particular below $-15°$ C. These blocks may in general have an average molecular weight of from $10^3$ to $2 \times 10^5$. In general they contain from 30 to 100, in particular from 30 to 95, % by weight, based on the particular block X of conjugated dienes in copolymerized form.

Blocks Y generally have a glass transition temperature Tg of more than 20° C. They have in general an average molecular weight of from $1.5 \times 10^3$ to $2 \times 10^6$, preferably from $5 \times 10^3$ to $1.5 \times 10^6$, in particular from $10^4$ to $1.2 \times 10^6$. They contain in general from 30 to 100, in particular from 40 to 90, % by weight, based on the particular block Y, of aromatic vinyl in copolymerized form.

Examples of advantageous conjugated dienes are butadiene, isoprene, penta-1,3-diene, 2,3-dimethylbutadiene and hexa-2,4-diene, of which butadiene and/or isoprene are preferred.

Examples of advantageous aromatic vinyls are styrene, α-methylstyrene, p-methylstyrene, p-tert.-butylstyrene and 1-vinylnaphthalene, of which styrene is preferred.

Examples of particularly advantageous block copolymers are the thermoplastically elastomeric three-block copolymers Y-X-X' where Y is a thermoplastic nonelastic styrene polymer block, X is an elastomeric butadiene and/or isoprene polymer block and X' is an elastomeric polymer block of copolymerized butadiene and/or isoprene other than X with or without copolymerized styrene.

Further examples of particularly advantageous block copolymers are four-block copolymers such as X-Y-X-Y, Y-X-X'-Y, Y-X-Y-X' or X-X'-Y-X.

Examples of particularly advantageous binders ($a_1$) from the class of alkadiene/acrylonitrile copolymers are the nitrile rubbers, such as butadiene/acrylonitrile copolymers having an acrylonitrile content of from 15 to 40% by weight, or nitrile rubbers of the type mentioned which contain photopolymerizable radicals ($a_3$).

Examples of particularly advantageous binders ($a_1$) from the class of the ethylene/propylene/alkadiene rubbers, which are also referred to as EPDM (ethylene/propylene/diene monomer) rubbers, are
ethylene-propylene-dicyclopentadiene,
ethylene-propylene-ethylidenenorbornene,
ethylene-propylene-trans-hexa-1,4-diene,
ethylene-propylene-dicyclopentadiene-ethylidenenorbornene,
ethylene-propylene-dicyclopentadiene-trans-hexa-1,4-diene,
ethylene-propylene-ethylidenenorbornene-trans-hexa-1,4-diene and
ethylene-propylene-ethylidenenorbornene-dicyclopentadiene-trans-hexa-1,4-diene terpolymers ($a_1$),
which contain in copolymerized form from 40 to 86% by weight of ethylene and sufficient alkadiene as to produce a double bond content of from 2 to 20 olefinic double bonds per 1000 carbon atoms, and the EPDM rubbers of the type mentioned which contain photopolymerizable radicals ($a_3$).

Examples of particularly advantageous binders ($a_1$) from the class of the ethylene/(meth)acrylic acid are those which are obtainable by copolymerization of monomer mixtures of $a_{11}$) ethylene, $a_{12}$) acrylic acid and/or methacrylic acid and $a_{13}$) vinyl esters, vinyl ethers, acrylic esters, methacrylic esters, acrylamides and methacrylamides in weight ratios governed by the following conditions:
parts by weight of $(a_{11})+(a_{12})+(a_{13})=100$,
30 parts by weight $\leq$ parts by weight of $(a_{11}) \leq 70$ parts by weight,
5 parts by weight $\leq$ parts by weight of $(a_{12}) \leq 50$ parts by weight and
5 parts by weight $\leq$ parts by weight of $(a_{13}) \leq 40$ parts by weight.

They may be prepared for example by the low density polyethylene (LDP) high pressure polymerization method at from 200° to 400° C. under more than 800 kg/cm² (see for example DE-B-2,341,462 and U.S. Pat. No. 3,264,272).

Suitable vinyl ester comonomers ($a_{13}$) are here in particular those of the general formula III

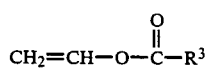

$$CH_2=CH-O-\overset{\overset{O}{\|}}{C}-R^3 \quad\quad III$$

where $R^3$ is alkyl or cycloalkyl of from 1 to 10 carbon atoms, for example vinyl acetate, vinyl propionate, vinyl butyrate, vinyl valerate or vinyl hexane carboxylate. Preference is given to vinyl acetate.

Suitable vinyl ether comonomers ($a_{13}$) are here in particular those of the general formula IV

$$CH_2=CH-OR^3 \quad\quad IV,$$

where $R^3$ is as defined above, for example vinyl ethyl ether, vinyl 1-propyl ether, vinyl 2-propyl ether, vinyl 1-butyl ether, vinyl 2-butyl ether or vinyl 1-pentyl ether. Preference is given to vinyl 1-butyl ether.

Suitable acrylic ester, methacrylic ester, acrylamide and methacrylamide comonomers ($a_{13}$) are here in particular those of the general formula V

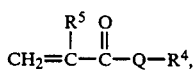

$$CH_2=\overset{\overset{R^5}{|}}{C}-\overset{\overset{O}{\|}}{C}-Q-R^4, \quad\quad V$$

where $R^5$ is methyl or hydrogen, $R^4$ is alkyl or cycloalkyl of from 1 to 10 carbon atoms or Ω-methyl poly(alkylene oxide)-α-oxy, and Q is oxygen or $NR^6$ where $R^6$ is H or $C_1$-$C_4$-alkyl. Examples of suitable acrylic esters, methacrylic esters, acrylamides and methacrylamides are methyl acrylate, methyl methacrylate, ethyl acrylate, ethyl methacrylate, propyl acrylate, propyl methacrylate, n-butyl acrylate, n-butyl methacrylate, n-pentyl acrylate, n-pentyl methacrylate, n-hexyl acrylate, n-hexyl methacrylate, tert-butyl acrylate, cyclohexyl acrylate, cyclohexyl methacrylate, 2-ethylhexyl acrylate, 2-ethylhexyl methacrylate, dicyclopentadienyl acrylate, $\Omega$-methyl poly(ethylene oxide)-$\alpha$-yl (meth)acrylate, $\Omega$-methyl poly(1,2-propylene oxide)-$\alpha$-yl (meth)acrylate, $\Omega$-methyl poly(1,3-propylene oxide)-$\alpha$-yl (meth)acrylate, N-methyl-N-butylmethacrylamide and N-ethyl-N-(2-ethylhexyl)acrylamide. Preference is given to n-butyl acrylate, 2-ethylhexyl acrylate, $\Omega$-methyl poly(ethylene oxide)-$\alpha$-yl acrylate and dicyclopentadienyl acrylate, of which in turn the first three are particularly preferred.

Examples of very particularly preferred copolymers are ethylene/(meth)acrylic acid copolymers which contain n-butyl acrylate, 2-ethylhexyl acrylate and/or $\Omega$-methyl poly(ethylene oxide)-$\alpha$-yl acrylate as comonomers ($a_{13}$) in copolymerized form.

The copolymers may also contain photopolymerizable radicals ($a_3$) of the general formula VI

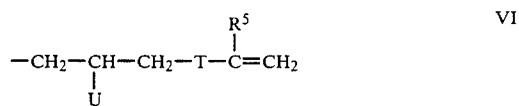

where
U is a hydroxyl, an amino or thiol group,
T is an ester, amino, ether or a $C_1$–$C_{10}$-alkanediyl group and
$R^5$ is hydrogen or methyl.

Examples of suitable photopolymerizable olefinically unsaturated radicals ($a_3$) are
2-hydroxy-5-oxo-4-oxahept-6-en-1-yl,
2-amino-5-oxo-4-oxahept-6-en-1-yl,
2-thiolo-5-oxo-4-oxahept-6-en-1-yl,
2-hydroxy-5-oxo-4-oxa-6-methylhept-6-en-1-yl,
2-amino-5-oxo-4-oxa-6-methylhept-6-en-1-yl,
2-hydroxy-5-oxo-4-azahept-6-en-1-yl,
2-amino-5-oxo-4-azahept-6-en-1-yl,
2-thiolo-5-oxo-5-azahept-6-en-1-yl,
2-hydroxy-5-oxo-4-aza-6-methylhept-6-en-1-yl,
2-hydroxy-5,10-dioxo-4,9-dioxa-6-aza-11-methyl-dodec-11-en-1-yl,
2-amino-5-oxo-4-aza-6-methyl-hept-6-en-1-yl,
2-thiolo-5-oxo-4-aza-6-methyl-hept-6-en-1-yl,
2-hydroxy-4-oxahex-5-en-1-yl, 2-amino-4-oxahex-5-en-1-yl,
2-thiolo-4-oxahex-5-en-1-yl, 2-hydroxy-hex-5-en-1-yl,
2-amino-hex-5-en-1-yl, 2-thiolo-hex-5-en-1-yl,
2-hydroxy-hept-6-en-1-yl, 2-amino-hept-6-en-1-yl and
2-thiolo-hept-6-en-1-yl. Preference is given to
2-hydroxy-5-oxo-4-oxa-6-methyl-hept-6-en-1-yl of the formula VII

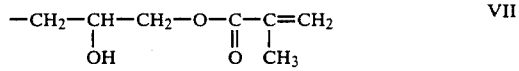

These photopolymerizable olefinically unsaturated radicals ($a_3$) may also be present in the other binders ($a_1$).

In addition, the copolymers may contain in addition to the photopolymerizable olefinically unsaturated radicals ($a_3$) or instead of these internal radicals of the general formula VIII

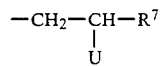

where $R^7$ is a polar group, hydrogen or a further group U.

Polar groups are groups which are capable of dipole-dipole, dipole-ion or ion-ion interaction.

Examples of suitable radicals of the general formula VIII are 2-hydroxy-eth-1-yl, 2-amino-eth-1-yl, 2-thiolo-eth-1-yl, 2,3-dihydroxy-prop-1-yl, 2-amino-3-hydroxy-prop-1-yl, 2-thiolo-3-hydroxy-prop-1-yl and 2-hydroxy-2-[$\Omega$-alkyl-poly(ethylene oxide)-$\alpha$-yl]-ethyl-1-yl.

The novel photopolymerizable recording layer (A) contains, based on its total amount, from 0.001 to 10, preferably from 0.1 to 7, advantageously from 0.2 to 5, in particular from 0.3 to 4, % by weight of one or more photopolymerization initiators ($a_2$), this amount also depending on the amount of component ($a_3$) also used.

Examples of suitable photopolymerization initiators ($a_2$) are benzoin and benzoin derivatives, such as methyl, isopropyl, n-butyl or isobutyl ether, symmetrically or asymmetrically substituted benzyl acetals, such as benzyl dimethyl acetal, benzyl methyl ethyl acetal; and acylarylphosphine oxides, such as 2-dimethoxybenzoyl diphenylphosphine oxide, 2,4,6-trimethylbenzoyldiphenylphosphine oxide, ethyl 2,4,6-trimethylbenzoylphenylphosphinate or sodium 2,4,6-trimethylbenzoylphenyl phosphinate or substituted or unsubstituted quinones, such as ethylanthraquinone, benzanthraquinone, benzophenone or 4,4'-bis(dimethylamino)benzophenone. They can be used alone or mixed with one another or combined with coinitiators, for example ethyl anthraquinone together with 4,4'-bis(dimethylamino)benzophenone, benzoin methyl ether with triphenylphosphine, diacylphosphine oxide with tertiary amines and acylarylphosphine oxides with benzyl dimethyl acetal.

The novel photopolymerizable recording layer (A) contains photopolymerizable olefinically unsaturated constituents ($a_3$). These are photopolymerizable olefinically unsaturated compounds (monomers) ($a_3$) which are compatible with the binder ($a_1$), or they are the photopolymerizable olefinically unsaturated radical ($a_3$) described above in the context of the polymeric binders ($a_1$), which radicals are bonded internally or terminally to the polymeric binders ($a_1$).

The monomers ($a_3$) and the photopolymerizable olefinically unsaturated radical ($a_3$) are present together in the novel recording layer (A) in a mixing ratio which may be widely varied. Together their amount in the novel photopolymeric recording layer (A), based on the total amount thereof, is from 0.5 to 60, preferably from 2 to 30 and in particular from 2 to 15, % by weight.

However, the novel photopolymerizable recording layer (A) may contain either only the monomers ($a_3$) or only the photopolymerizable olefinically unsaturated radicals ($a_3$).

If the novel photopolymerizable recording layer (A) contains only photopolymerizable olefinically unsaturated radicals ($a_3$), the amount thereof is from 0.5 to 60, preferably from 2 to 30 and in particular from 2 to 15, % by weight of the novel photopolymerizable recording layer (A).

If the novel photopolymerizable recording layer (A) contains only monomers ($a_3$), the amount thereof is from 0.5 to 60, preferably from 2 to 30, in particular from 2 to 15, % by weight of the novel photopolymerizable recording layer (A).

Suitable monomers (a$_3$) have in general a boiling point of above 100° C. at atmospheric pressure and a molecular weight of up to 3000, in particular of up to 2000. In general, suitable monomers (a$_3$) are esters of acrylic acid and of methacrylic acid, styrene and derivatives thereof, esters of fumaric acid and of maleic acid, vinyl esters, vinyl ethers, acrylamides, methacrylamides and allyl compounds. The prerequisite for their being useable is that they meet the claim condition of being compatible with the binder (a$_1$).

Examples of particularly highly suitable monomers (a$_3$) which have a particularly advantageous effect are butyl acrylate, butyl methacrylate, 2-ethylhexyl acrylate, lauryl (meth)acrylate, ethylene glycol di(meth)acrylate, 1,4-butanediol di(meth)acrylate, neopentylglycol di(meth)acrylate, 3-methylpentanediol di(meth)acrylate, 2-hydroxypropyl (meth)acrylate, 2-hydroxyethyl (meth)acrylate, 1,6-hexanediol di(meth)acrylate, 1,1,1-trimethylolpropane tri(meth)acrylate, di-, tri- and tetraethylene glycol di(meth)acrylate, tripropylene glycol di(meth)acrylate, pentaerythritol tetra(meth)acrylate poly(ethylene oxide) di(meth)acrylate Ω-methyl poly(ethylene oxide)-α-yl (meth)acrylate, N,N-diethylaminoethyl acrylate, a reaction product of 1 mole of glycerol, 1 mole of epichlorohydrin and 3 moles of acrylic acid, isobornyl acrylate, isobornyl methacrylate, dihydrodicyclopentadienyl acrylate, dihydrodicyclopentadienyl methacrylate, hex-1-en-6-yl acrylate, hex-1-en-6-yl methacrylate, dihydroxylimonene diacrylate, dihydroxylimonene dimethacrylate, dicyclopentyldimethylene diacrylate, dicyclopentyldimethylene dimethacrylate, thiodiethylene glycol diacrylate, thiodiethylene glycol dimethacrylate, benzyl acrylate, benzyl methacrylate, dodecandiol diacrylate, dodecandiol dimethacrylate, dibutyl fumarate, di-n-octyl fumarate, divinylbenzene, vinyl oleate, octadecyl vinyl ether, 1,4-butanediol divinyl ether, diallyl phthalate and bisallyl itaconate.

The novel photopolymerizable recording layer (A), in addition to the essential lecithins I and/or II (=additives a$_{41}$), may contain one or more further additives (a$_4$) whereby the application profile of the novel layer (A) of the recording element according to the invention and of the relief plates and relief printing plates produced therefrom can be varied.

They are in particular plasticizers, inhibitors of thermally initiator polymerization, dyes, pigments, photochromic assistants, agents for improving the relief structure, crosslinking aids, antioxidants, antiozonants, fillers, free-flow agents or mold release agents. The amount of any of these further additives (a$_4$) relative to the amount of the essential lecithins I and/or II (additives a$_{41}$) should in general not exceed 40% by weight of the novel photopolymerizable recording layer.

Examples of plasticizers are modified and unmodified natural oils and resins, such as paraffinic or naphthenic oils, petroleum resins or pentaerythritol esters of hydrogenated rosin, alkyl, alkenyl, arylalkyl or arylalkenyl esters of acids, such as citric acid, acetic acid, propionic acid, butyric acid, ethyl butyric acid, ethyl hexanoic acid, glycolic acid, benzoic acid, phthalic acid, trimellitic acid, abietic acid, phosphoric acid or stearic acid, synthetic oligomers or resins, such as oligostyrene, oligomeric styrene-butadiene copolymers, oligo-α-methylstyrene, oligomeric α-methylstyrene/p-oligo-α-methylstyrene copolymers, liquid 1,2- or 1,4-oligobutadienes, oligopentadienes, liquid oligomeric acrylonitrile-butadiene copolymers, polyoctenamers having a molecular weight of from $10^3$ to $1.2 \times 10^5$, which are as is known macrocycles of poly(octenylene), and also polyterpene, polyacrylate, polyester or polyurethane resins, synthetic polymers, such as polyethylene or ethylene/propylene/diene rubbers, Ω-methyl oligo(ethyleneoxide), and sulfonamides. Of advantage are amounts of from 1 to 25% by weight, based on the novel photopolymerizable recording layer (A).

Inhibitors of thermally initiated polymerization can in general be added in an amount of from 0.001 to 2% by weight, based on the novel photopolymerizable recording layer (A). They do not show any significant self-absorption in the actinic region in which the photopolymerization initiator (a$_2$) is absorptive. Examples of inhibitors are hydroquinone, p-methoxyphenol, 2,6-di-tert-butyl-p-cresol, β-naphthol, phenothiazine, pyridine, nitrobenzene, m-dinitrobenzene, chloranil, thiazine dyes, such as Thionine Blue G (C.I. 52025), methylene blue B (C.I. 52015), toluidine blue (C.I. 52040), N-nitrosamine, such as N-nitrosodiphenylamine, and the salts, for example potassium, calcium or aluminum salts, of N-nitrosocyclohexylhydroxylamine.

Dyes, pigments or photochromic additives may be added to the novel photopolymerizable recording layer (A) in an amount of from 0.0001 to 2% by weihht, based on the novel photopolymerizable recording layer (A). They serve to control the exposure properties, to identify the recording element and to allow the exposure result to be directly inspected, or they have esthetic purposes. The prerequisite for the selection and the amount of such additives is that they, like the thermal polymerization inhibitors, do not interfere with the photopolymerization. It is possible to use for example soluble phenazinium, phenoxazinium, acridinium and phenothiazinium dyes. These dyes are also used together with a sufficient amount of a reducing agent which does not reduce the dye in the absence of actinic light but which on irradiation is capable of reducing the dye in the excited state. Examples of such mild reducing agents are ascorbic acid, anethol, thiourea, eg. diethylallylthiourea, in particular N-allylthiourea, and hydroxylamine derivatives, in particular salts of N-nitrosocyclohexylhydroxylamine, preferably the potassium, calcium and aluminum salts. The aforementioned salts may also serve, as mentioned above, as thermal polymerization inhibitors. The reducing agents are in general used in amounts of from 0.005 to 5% by weight, based on the novel photopolymerizable recording layer (A), and, in many cases have proven optimal in an amount which is from 3 to 10 times the amount of dye used.

Examples of crosslinking aids are the customary and known tri- and tetra-functional thiol compounds.

Examples of antioxidants are sterically hindered monophenols, such 2,6-di-tert-butyl-p-cresol, alkylated thiobisphenols and alkylidene bisphenols, such as 2,2'-methylene-bis-(4-methyl-6-tert-butylphenol) or 2,2'-bis-(1-hydroxy-4-methyl-6-tert-butyphenyl)sulfise, hydroxybenzyls such as 1,3,5-trimethyl-2,4,6-tris-(3,5-di-tert-butyl-4-hydroxybenzyl)benzene, triazines, such as 2-(4-hydroxy-3,5-tert-butylanilino)-4,6-bis-(n-octylthio)-1,3,5-triazine, polymerized trimethyldihydroquinone, zinc butyl dithiocarbamate, dilauryl thiodipropionate, and phosphites, such as tris(nonylphenyl) phosphite. Of advantage are amounts of from 0.0001 to 5% by weight, based on the novel photopolymerizable recording layer (A).

Examples of polymeric or non-polymeric organic and inorganic fillers or reinforcing agents which are not molecularly dispersible are those which substantially transmit the light of the wavelength used for irradiating the mixtures according to the invention, which do not scatter this light and which in terms of refractive index substantially match the mixture in question, for example polystyrene, organophilic silicon dioxide, bentonite, silica, Aerosil, organophilic aluminum oxide, glass powder, colloidal carbon and various kinds of dyes and pigments. These additives are used in amounts which vary with the desired properties of the recording element according to the invention. The fillers have the advantage that they improve the strength and abrasion resistance of the novel photopolymerizable recording layer (A) and of the relief layer (A') produced therefrom, reduce their tackiness and in certain circumstances act therein as coloring agents.

An example of a free-flow agent is calcium stearate.

An example of a mold release agent is talc.

Examples of antiozonants are the customary and known ozone protection waxes and chloroalkanes (chloroparaffins) having from 8 to 40 carbon atoms and from 30 to 73% by weight of chlorine in the molecule.

The thickness of the novel photopolymerizable recording layer (A) depends first and foremost on the intended use of the recording element according to the invention. For instance, the thickness varies in general from 0.001 to 7, preferably from 0.1 to 7, in particular from 0.7 to 6.5, mm, since the relief plates and relief printing plates produced from recording elements according to the invention which contain novel photopolymerizable recording layers (A) of this thickness are suitable for photoresist work and the majority of printing techniques.

As well as the novel photopolymerizable recording layer (A) the recording element according to the invention may contain further layers of use for its function.

For instance, the novel photopolymerizable recording layer (A) can be firmly or detachably bonded to a dimensionally stable base (B). The dimensionally stable base (B) can in turn rest on a resilient and flexible support (S). Furthermore, a firm bond can be obtained between the base (B) and the novel layer (A) by means of an adhesion-promoting layer (APL). If the base (B) is easily detachable from the novel layer (A), it is also referred to as a temporary base (B).

Possible dimensionally stable bases (B) are plates, foils, films or conical or cylindrical sleeves made of metals, such as steel, aluminum, copper or nickel, or plastics, such as polyethylene terephthalate, polybutylene terephthalate, polyamide or polycarbonate. Besides these possibilities it is also possible to use woven and bonded fabrics, for example glass fiber fabrics or bonded, composite materials formed for example from glass fibers and plastics such as polyethylene terephthalate. Other possible bases (B) are plates or boards of the kind customarily used in the fabrication of the circuit boards.

The adhesion-promoting layers (APL) advantageously comprise layers, approximately from 0.5 to 40 $\mu$m in thickness, of mixtures of adhesive-forming components.

If the base (B) used is a highly reflective plate, board, film or foil, it may contain suitable antihalation agents, such as carbon black or manganese dioxide. However, antihalation agents may also be applied as a separate layer atop the base (B) or be included in the adhesion-promoting layer (APL) or in the novel layer (A).

Furthermore, the recording element according to the invention may contain a light-transmitting smooth or matt non-tacky cover layer (CL) which is soluble or swellable in the developer solvent of the novel photopolymerizable recording layer (A) and which adheres more firmly to the novel photopolymerizable recording layer (A) than to any cover sheet (CS), and which is formed by a polymer which forms tear-resistant films and any additives present in the polymer.

Examples of suitable polymers which form tear-resistant films are polyamides, copolyamides, polyurethanes, poly(meth)acrylates, polyvinyl alkane carboxylates, hydrolyzed to from 30 to 99%, cyclorubbers of high degree of cyclization, ethylene/propylene copolymers, homopolymers and copolymers of vinyl chloride and ethylene/vinyl acetate copolymers.

Examples of suitable cover layers (CL) which contain additives are known from U.S. Pat. No. 4,162,919, DE-A-2,823,300, DE-B-2,123,702, U.S. Pat. No. 4,072,527 and U.S. Pat. No. 3,453,311.

Examples of particularly highly suitable cover layers (CL) which contain additives are described in German Patent Application P 37 36 980.6 (O.Z. 0050/39548).

In general, the cover layers are from 0.2 to 25 $\mu$m in thickness.

Furthermore, the recording element according to the invention may contain a cover sheet (CS) which is easily detachable from the novel photopolymerizable recording layer (A) or from the cover layer (CL).

Cover sheets (CS) are from 10 to 250, in particular from 20 to 150, $\mu$m in thickness. They consist essentially of plastics, textile materials, papers or metals. The surface of the cover sheet (CS) which is directly adjacent to the cover layer (CL) is smooth, ie it has a surface roughness $R_{max}$ of $\leq$0.1 $\mu$m, or it is matt, ie. it has a surface roughness $R_{max}$ of from 0.1 to 15, preferably from 0.3 to 10, in particular from 0.5 to 7, $\mu$m. If the cover sheet (CS) is matt, its roughness pattern becomes embossed in the cover layer (CL) and perhaps even in the surface of the novel photopolymerizable recording layer (A). This smooth or matt surface of the cover sheet (CS) can also have an antiadhesive finish; that is, it may for example bear an antiadhesion layer (AAL) from 0.1 to 0.5 $\mu$m in thickness formed from customary and known silicones or from other plastics such as polyethylene or polypropylene. Cover sheets (CS) made of textile materials or papers may in addition be impregnated with plastics such as urea-formaldehyde or polyolefins. Cover sheets (CS) made of plastics, moreover, may be biaxially oriented. In this case it is frequently of advantage to precede the biaxial orientation by the application of a layer, from 0.1 to 0.5 $\mu$m in thickness, of for example a vinylidene chloride copolymer to that side of the cover sheet (CS) which will later be directly adjacent to the cover layer (CL) or the novel photopolymerizable recording layer (A).

Examples of particularly advantageous cover sheets (CS) are 20–150 $\mu$m thick, smooth or matt, biaxially oriented or non-oriented, adhesion-promoting or antiadhesive films formed from polyethylene, polypropylene, polyamide, polystyrene, styrene/acrylonitrile copolymers or from polymethyl methacrylate, or from copolymers of methyl methacrylate with methacrylic acid, acrylic acid or methyl acrylate or butyl acrylate, or from polyvinyl chloride, polyvinyl acetate, vinyl chloride/vinyl acetate copolymers, polyvinyl alcohol, polyvinyl pyrrolidone, polycarbonate, cellulose esters, such as cellulose acetate succinate, or from polyethylene terephthalate. Of these cover sheets (CS), those made of polyethylene terephthalate are particularly advantageous.

The preparation of the recording element according to the invention has no technical particularities but is effected by a conventional and known method of preparing light-sensitive layers and cover layers and by a conventional and known method of preparing sheetlike materials from plastics, textiles, papers or metals.

For instance, the novel photopolymerizable recording layers (A) are customarily prepared by mixing the above-described constituents ($a_1$), ($a_2$), ($a_3$), ($a_{41}$) and any ($a_4$) by conventional kneading, mixing and dissolving techniques and by forming the resulting mixtures (A) by casting from solution, hot pressing, calendering or extruding. If the recording element according to the invention consists only of the novel photopolymerizable recording layer (A), the preparation of the latter concludes the method of preparation as a whole. In this case the process for preparing the novel photopolymerizable recording layer (A) is an essential step in the process according to the invention for improving the relief structure of relief plates and relief printing plates.

If the recording element according to the invention contains further layers, further operations have to be carried out, either as part of the process for preparing multilayered recording elements according to the invention, or separately therefrom.

For instance, the cover layer (CL) is customarily prepared by a method which also comes into consideration for preparing the novel photopolymerizable recording layer (A).

The constituents of the cover sheet (CS) are likewise mixed by means of customary kneading, blending and dissolving techniques and formed into the corresponding sheets by casting from solution, hot pressing, calendering or extruding and blow molding. These operations too may be integrated in the process for preparing the recording element according to the invention, but customarily the cover sheet (CS) is prepared separately, wound in reel form and employed in this form for preparing a multilayered recording element according to the invention.

Nor does the preparation of the multilayered recording element according to the invention have any technical particularities; instead it is effected in a conventional manner by bonding the novel photopolymerizable recording layer (A) to the cover layer (CL) and the cover sheet (CS), which may also take place on a dimensionally stable base (B) with or without inclusion of an adhesion-promoting layer (APL) and a resilient and flexible support (S). It is basically possible here to bond the novel photopolymerizable recording layer (A) first to the base (B) and then on its uncovered side to the cover layer (CL) and the cover sheet (CS), or, however, to apply the novel photopolymerizable recording layer (A) first to the cover layer (CL) atop the cover sheet (CS) and only then to the base (B).

The single- or multi-layered recording element according to the invention has particular advantages. For instance, it is preparable in a conventional manner and thus does not require any retrofitting of the existing apparatus and equipment or indeed capital expenditure on new, purpose-built apparatus and equipment. It is dimensionally stable and is not prone to cold flow, nor does it exude components present therein. It is therefore safely transportable and storable for a prolonged period without any risk of damage.

The particular advantages of the single- or multi-layered recording element according to the invention become convincingly evident if it is used for preparing decorative relief plates, intaglio printing plates and photoresists, but in particular letterpress and flexographic printing plates. This preparation of decorative relief plates, letterpress, flexographic and intaglio printing plates and photoresists from a single- or multi-layered recording element according to the invention customarily comprises the following steps:

(i) pretreating the recording element according to the invention if necessary, (ii) detaching any cover sheet (CS) from any cover layer (CL) or from the novel photopolymerizable recording layer (A), (iii) placing an image mask or negative original on the novel photopolymerizable recording layer (A) or on any cover layer (CL), (iv) subjecting the novel photopolymerizable recording layer (A) to imagewise exposure under actinic light of a wavelength $\lambda$ of from 230 to 450, in particular from 350 to 450, nm, (v) washing out (developing) the non-irradiated and thus non-photopolymerized areas of the recording layer (A) which has been subjected to imagewise exposure by means of a suitable liquid developer, which also serves to wash out any cover layer (CL), and (vi) drying and also (vii) if necessary aftertreating the resulting decorative relief or letterpress, flexographic or intaglio printing plate or photoresist which then contains or consists of the photopolymerized relief layer (A').

These steps are an integral part of the process according to the invention for improving the relief structure of decorative relief plates, letterpress, flexographic and intaglio printing plates and photoresists.

The thickness of the photopolymerized relief layer (A') varies with the intended use of the relief plate or relief printing plate from 0.001 to 7, preferably from 0.1 to 7, in particular from 0.7 to 6.5, mm.

A customary pretreatment consists in the uniform irradiation of the novel photopolymerizable recording layer (A) with actinic light from the back. The back here is to be understood as meaning the side which is remote from the later photopolymerized relief layer (A').

Suitable light sources for actinic light are commercial UV fluorescent tubes, medium, high and low pressure mercury lamps, superactinic fluorescent tubes, pulsed xenon lamps, metal iodide doped lamps, carbon arc lamps and lasers such as gas lasers.

Examples of suitable organic developers are aliphatic or aromatic hydrocarbons, such as n-hexane, n-heptane, octane, petroleum ether, naphtha, limonene or other terpenes, toluene, xylene, ethylbenzene or isopropylbenzene or mixtures thereof, ketones, such as acetone or methyl ethyl ketone, ethers, such as di-n-butylether, esters, such as ethyl acetate or ethyl acetoacetate, halogenated aliphatic hydrocarbons, such as methylene chloride, chloroform, trichloroethanes, tetrachloroethylene, dichlorotetrafluoroethane or trichlorotrifluoroethanes, mixtures which contain two or more of these solvents, mixtures which contain one or more of these solvents and in addition an alcohol, such as methanol, ethanol, isopropanol or n-butanol, and solvents, and mixtures of the type mentioned, which in addition contain solid, liquid or gaseous organic and inorganic compounds, for example surfactants, in minor amounts.

Examples of suitable aqueous alcoholic developers are aqueous solutions of methanol, ethanol, isopropanol or n-butanol, which may in addition contain solid, liquid or gaseous organic and inorganic compounds, for example surfactants, complexing agents, salts, alkali metal hydroxide solutions, ammonia or amines, in minor amounts.

Examples of suitable aqueous alkaline developers are aqueous solutions of lithium hydroxide, sodium hydroxide or potassium hydroxide or of lithium carbonate, sodium carbonate, potassium carbonate, lithium bicarbonate, sodium bicarbonate or potassium bicarbonate, or of ammonia, which may in addition contain solid, liquid or gaseous organic and inorganic compounds, for example surfactants, complexing agents or salts in minor amounts.

A further suitable developer is water.

Customary methods of aftertreating the photopolymerized relief layer (A') are the uniform exposure to actinic light of a wavelength λ of from 150 to 450 nm, the subsequent exposure to visible light or the treatment with a halogen-containing solution.

If the single- or multi-layered recording element according to the invention is subjected to this process, it is found to be
- rapidly exposable with an exceedingly large exposure latitude,
- faithful in the reproduction even of extremely fine and hence critical motives of image masks or negative originals, also showing an excellent relief fine structure which is particularly noticeable in the shadow well depths, and
- remarkably stable to washing out, so that development conditions can be safely intensified in order to shorten development times.

This consequently shortens the cycle times in the production of decorative relief plates, letterpress, flexographic and intaglio printing plates and photoresists, which constitutes an appreciable advantage under commercial constraints.

This advantage is particularly evident in the production of relief printing plates.

Nor does this exhaust the particular advantages of the recording element according to the invention, which become manifest in a particularly convincing fashion in relief printing plates and photoresists produced in the above-described manner:

For instance, the novel photoresists can be used with advantage for fabricating circuit boards. The novel relief printing plates are mountable on printing cylinders and are highly useful in this form for continuous printing, producing excellent prints in particularly long runs.

EXAMPLES

Examples 1 TO 4

The preparation of the recording element according to the invention and its further processing into novel relief printing plates.

General experimental directions:

Method I

To prepare the novel photopolymerizable recording layer (A), the binder ($a_1$) was uniformly introduced into a twin-screw devolatilization extruder and melted at 140°–180° C. The liquid and/or dissolved constituents ($a_2$), ($a_3$), ($a_{41}$) and any ($a_4$) of the novel photopolymerizable recording layer (A) were pumped in succession into the extruder and mixed therein with the melt of the binder ($a_1$). The resulting photopolymerizable mixture (A) was discharged from a broad-slot die and passed directly from there to the nip of a calender, where it was formed into a novel photopolymerizable recording layer (A) and at the same time firmly bonded on one of its sides to a 5 μm thick cover layer (CL) and a matt 125 μm thick polyethylene terephthalate film (cover sheet CS) and on the other side via a 5 μm thick adhesion-promoting layer (APL) to a 125 μm thick polyethylene terephthalate film as dimensionally stable base (B).

The resulting multilayered recording element of structure (B)/(A)/(C)/(D) according to the invention was uniformly irradiated for up to 3 minutes from the back with actinic light through the dimensionally stable base (B) in a tubular exposure unit. Thereafter the polyethylene terephthalate cover sheet (CS) was peeled off the cover layer (CL).

After this pretreatment the multilayered recording element according to the invention was subjected to imagewise exposure under actinic light for from 2 to 30 minutes in a commercial flat exposure unit through a conventional test negative original placed atop the cover layer (CL) and then washed out for from 2 to 20 minutes in a brush washer with a suitable developer.

The relief printing plate thus obtained was if appropriate dried at from 20° to 80° C. for up to an hour. Thereafter the novel relief printing plate was stored for fifteen hours.

The relief printing plate was then if appropriate uniformly afterexposed to actinic light of a wavelength λ=250–400 nm for up to 20 minutes or treated with a solution which contains free halogen.

Method II

To prepare the novel photopolymerizable recording element (A), its constituents ($a_1$), ($a_2$), ($a_3$), ($a_{41}$) and any ($a_4$) were dissolved in a suitable solvent. The resulting solution was cast onto a steel plate (=dimensionally stable base B) provided with an antihalation agent layer in such a way that, after the resulting wet layer had dried, the novel photopolymerizable recording layer (A) was obtained in the desired thickness.

This multilayered recording element of structure (B)/(A) according to the invention was stored for fifteen hours. Thereafter the multilayered recording element according to the invention wa subjected to imagewise exposure and development as described in Method I. Imagewise exposure was if appropriate preceded by uniform irradiation of the novel photopolymerizable recording layer (A) with actinic light.

Table 1 indicates the material composition of the recording element according to the invention, the manner of its fabrication and its subsequent use to produce novel relief printing plates.

Test methods and assessment criteria

The photopolymerized relief layer (A') of the relief printing plates prepared by Method I or II were inspected visually under an optical microscope, and their shadow well depths were measured in μm for screens of tonal value 30%, 50% and 70% [$t_d$ (30), $t_d$ (50) and $t_d$ (70)]. The main criteria for judging the quality of the photopolymerized relief layers (A') were (i) well-formed, steep relief flanks free of under-penetrations,
(ii) straight relief edges free of breakouts, and
(iii) well-formed shadow well depths.

Following visual inspection of the photopolymerized relief layers (A') of the relief printing plates, the plates were clamped onto printing cylinders and, depending on the particular relief printing plate, used for continuous letterpress or flexographic printing using the appropriate press for each printing technique and appropriate typical and conventional printing inks. The decisive quality criterion for the novel relief printing plates produced from a multilayered recording element according to the invention was the length of run of excellent prints obtainable therewith.

Table 2 summarizes the experimental results in question.

COMPARATIVE TESTS CT 1 TO CT 4

The preparation of known recording elements and their subsequent processing into known relief printing plates.

Each of Examples 1 to 4 was repeated under strictly comparable conditions, except that in each case the addition of essential lecithins I and/or II [constituent $(a_{41})$] was dispensed with. To compensate for this, the proportion of constituent $(a_3)$ in the particular known photopolymerizable recording layer (A) used was increased by a corresponding amount.

The material composition, the manner of preparation and the manner of further processing of the recording elements CT 1 to CT 4 are likewise given in Table 1.

The experimental results obtained therewith are compared in Table 2 with the experimental results obtained with the novel relief printing plates 1 to 4 (Examples 1 to 4).

A direct comparison is possible between Example 1 and Comparative Test CT 1, between Example 2 and Comparative Test CT 2, between Example 3 and Comparative Test CT 3 and between Example 4 and Comparative Test CT 4.

The comparison shows that recording elements 1 to 4 according to the invention were very clearly superior to the known recording elements CT 1 to CT 4. More particularly, the recording elements 1 to 4 according to the invention gave relief printing plates which had appreciably better photopolymerized relief layers (A') and which produced longer runs of excellent prints than the known relief printing plates. This substantiates the particular unforeseeable technical effect of lecithins I and/or II to be used according to the invention, but in particular that of soybean lecithin.

TABLE 1

Material composition and the manner of preparation and further processing of recording elements according to the invention (Examples 1 to 4) and according to the prior art (Comparative Tests CT 1 to CT 4)

| Example | Method | Material composition of photopolymerizable recording layer (A) Constituents | | | | | Thickness (μm) | Further processing Exposure time and development | After-treatment |
|---|---|---|---|---|---|---|---|---|---|
| | | $(a_1)$ (wt. %) | $(a_2)$ (wt. %) | $(a_3)$ (wt. %) | $(a_{41})$ (wt. %) | $(a_4)$ (wt. %) | | | |
| 1 | II (9:1) Methanol/water | Copolyamide of ε-caprolactam, hexamethylenediammonium adipate, 4,4'-diaminodicyclohexylmethane and adipic acid (54.792) | Benzil dimethyl acetal (1.1) | Pentaerythritol glycidyl ether triacrylate (22.83) Phenyl glycidyl ether acrylate (18.264) | Soybean lecithin (2.74) | N-Nitrosocyclohexyl hydroxylamine potassium salt (0.274) | 500 | 6 min with alcohol/water at 30° C. | Drying 80° C., 15 min |
| 2 | II Water | Polyvinyl alcohol hydrolysis degree 88% (52.379) | 2,4,6-Trimethylbenzoyldiphenylphosphine oxide (0.427) | 2-Hydroxyethyl acrylate (35.273) Butanediol monoacrylate (10.688) | Soybean lecithin (1.068) | 2,6-Di-tert-butyl-p-cresol (0.16) Duasyn (C.I. 50240) (0.005) | 500 | 2.5 min with water at 40° C. | Drying 80° C., 15 min |
| 3 | II Toluene | Terpolymer of ethylene, acrylic acid and n-butyl acrylate (66.31) | Benzil dimethyl acetal (1.42) | Hexanediol diacrylate (11.35) | Soybean lecithin (2.85) | N-Nitrosocyclohexylhydroxylamine potassium salt (0.455) Duasyn (C.I. 50240) (0.005) N-Butylphenylsulfonamide (11.00) Propylethanolamine (6.61) | 500 | 3.5 min with water at 60° C. | Drying 80° C., 5 min |
| 4 | I | As Example 3 (68.997) | Benzil dimethyl acetal | Methyl methacrylate | Soybean lecithin (1.5) | N-Nitrosocyclohexylhydroxyl- | 2840 | 25 min with 1% strength | Drying 40° C., 60 min |

TABLE 1-continued

|  | (1.0) | (7.5) Glycidyl methacrylate (5) | amine potassium salt (1.2) Duasyn (C.I. 50240) (0.003) N-Butyl-phenylsulfonamide (10) Butylethanolamine (4) 2,6-di-tert-butyl-p-cresol (0.8) | sodium carbonate solution at 60° C. | After-exposure with a low-pressure mercury lamp, 20 min |
|---|---|---|---|---|---|
| Comparative Tests | | | | | |
| CT 1 | Same as Example 1 | Same as Example 1, except that no soybean lecithin is used and the recording layer contained instead 2.74% by weight more of phenyl glycidyl ether acrylate (a₃) | | Same as Example 1 | |
| CT 2 | Same as Example 2 | Same as Example 2, except that no soybean lecithin is used and the recording layer contained instead 1.068% by weight more of 2-hydroxyethyl acrylate (a₃) | | Same as Example 2 | |
| CT 3 | Same as Example 3 | Same as Example 3, except that no soybean lecithin is used and the recording layer contained instead 2.85% by weight more of hexanediol diacrylate (a₃) | | Same as Example 3 | |
| CT 4 | Same as Example 4 | Same as Example 4, except that no soybean lecithin is used and the recording layer contained instead 1.5% by weight more of methyl methacrylate (a₃) | | Same as Example 4 | |

TABLE 2

| | Type of relief printing plate | Printing trials Quality of relief layer (A') | | Shadow well depth (μm) | | | Run of excellent prints |
|---|---|---|---|---|---|---|---|
| | | Relief flanks | Relief edges | $t_d(30)$ | $t_d(50)$ | $t_d(70)$ | |
| Example No. | | | | | | | |
| 1 | Letterpress | Steep, no under-penetrations | Straight, no breakouts | 157 | 125 | 104 | $10^6$ |
| 2 | Letterpress | Steep, no under-penetrations | Straight, no breakouts | 152 | 122 | 104 | $10^6$ |
| Comparative Tests | | | | | | | |
| CT 1 | Letterpress | Steep, with very few under-penetrations | Straight, with few breakouts | 125 | 77 | 42 | $10^5$ |
| CT 2 | Letterpress | Less steep, with under-penetrations | Rough, with some breakouts | 141 | 89 | 65 | $10^5$ |
| Example No. | | | | | | | |
| 3 | Letterpress | Steep, no under-penetrations | Straight, no breakouts | 187 | 132 | 95 | $5 \times 10^5$ |
| 4 | Flexographic | Steep, tack-free, no under-penetrations | Straight, no breakouts | 160 | 105 | 92 | $>10^5$ |
| Comparative Tests | | | | | | | |
| CT 3 | Letterpress | Less steep, with very few under-penetrations | Straight, with some breakouts | 85 | 45 | 22 | $10^4$ |
| CT 4 | Flexographic | Less steep, tacky, with some under-penetrations | Rough | 98 | 37 | <20 | $<5 \times 10^4$ |

We claim:

1. A light-sensitive recording element for preparing relief printing plates, comprising a dimensionally stable base (B) and at least one photopolymerizable recording layer (A) having a thickness of from 0.1 to 7 mm consisting essentially of (a₁) at least one polymer as binder, (a₂) at least one photopolymerization initiator, (a₃) at least one photopolymerizable olefinically unsaturated compound (monomer) which is compatible with polymeric binder (a₁) and/or photopolymerizable olefinically unsaturated radicals linked internally and/or terminally to polymeric binder (a₁), and (a4) at least one additive, the said additive or at least one of the said additives being present in the amount of from 0.1 to 10% by weight, based on the complete weight of the photopolymerizable recording layer (A), and being selected from the group consisting of the (a41) lecithins of the general formulae I and II

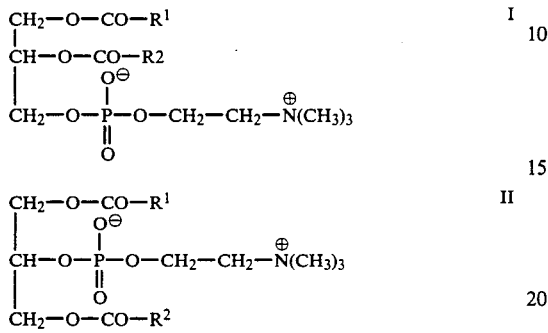

where $R^1$ and $R^2$, which may be identical to or different from each other, are $C_{11}$–$C_{18}$-alkyl or $C_{11}$–$C_{18}$-alkenyl with the proviso that at least one of $R^1$ and $R^2$ is $C_{11}$–$C_{18}$-alkenyl.

2. The light-sensitive recording element of claim 1, containing, as the lecithins of the general structures I and II, soybean lecithin.

3. A process for preparing a relief printing plate comprising a relief layer (A') having an improved relief structure from a light-sensitive recording element comprising a dimensionally stable base (B) and a photopolymerizable recording layer (A), the said process comprising the steps of (1) irradiating imagewise with actinic light a polymerizable recording (A) having a thickness of from 0.1 to 7 mm and consisting essentially of (a1) at least one polymer as binder, (a2) at least one photopolymerization initiator, (a3) at least one photopolymerizable olefinically unsaturated compound (monomer) which is compatible with polymeric binder (a1) and/or photopolymerizable olefinically unsaturated radicals linked internally and/or terminally to polymeric binder (a1), and (a4) at least one additive, the said additive or at least one of the said additives being present in the amount of from 0.1 to 10% by weight, based on the complete weight of the photopolymerizable recording layer (A), and being selected from the group consisting of the (a41) lecithins of the general formulae I and II

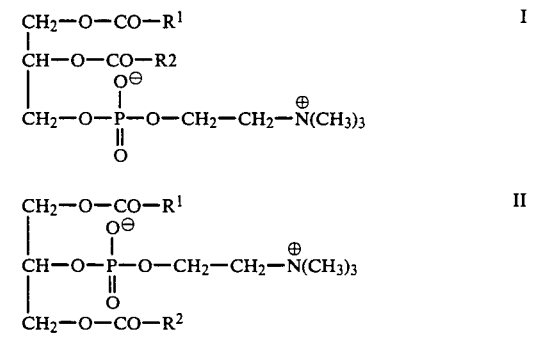

where $R^1$ and $R^2$, which may be identical to or different from each other, are $C_{11}$–$C_{18}$-alkyl or $C_{11}$–$C_{18}$-alkenyl with the proviso that at least one of $R^1$ and $R^2$ is $C_{11}$–$C_{18}$-alkenyl, thereby photopolymerizing the irradiated areas of the said recording layer (A), (2) washing out (developing) the non-irradiated and thus non-photopolymerized areas of the said imagewise irradiated recording layer (A) with a liquid developer, thereby obtaining the said relief layer (A') having an improved relief structure.

4. The process of claim 3, wherein the photopolymerizable recording layer (A) contains, as lecithins of the general structures I and II, soybean lecithin.

* * * * *